United States Patent
Kim et al.

(10) Patent No.: US 8,526,258 B2
(45) Date of Patent: Sep. 3, 2013

(54) VARIABLE RESISTANCE MEMORY DEVICE AND RELATED METHOD OF OPERATION

(75) Inventors: Deok-kee Kim, Yongin-si (KR); Ho Jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 240 days.

(21) Appl. No.: 13/026,456

(22) Filed: Feb. 14, 2011

(65) Prior Publication Data
US 2011/0228585 A1 Sep. 22, 2011

(30) Foreign Application Priority Data
Mar. 16, 2010 (KR) ................. 10-2010-0023371

(51) Int. Cl.
*G11C 7/02* (2006.01)
(52) U.S. Cl.
USPC ............... 365/210.1; 365/185.2; 365/113; 365/163
(58) Field of Classification Search
USPC ................ 365/210.1, 185.2, 113, 163
See application file for complete search history.

(56) References Cited

U.S. PATENT DOCUMENTS
2003/0039162 A1* 2/2003 Baker ................. 365/210
2009/0034320 A1 2/2009 Ueda FOREIGN PATENT DOCUMENTS
JP 2008171541 A 7/2008
JP 2009037703 A 2/2009
JP 2009080901 A 4/2009

OTHER PUBLICATIONS
Xu, N. et al., "Bipolar switching behavior in TiN/ZnO/Pt resistive nonvolatile memory with fast switching and long retention", Semiconductor Science and Technology, 23 (2008) 075019, pp. 1-4.

* cited by examiner

Primary Examiner — Jason Lappas
(74) Attorney, Agent, or Firm — Volentine & Whitt, PLLC

(57) ABSTRACT

A variable resistance memory device comprises a memory cell comprising a variable resistance device and a select transistor connected in series to the variable resistance device. The variable resistance memory device further comprises a write driver for supplying a write voltage to opposite sides of the memory cell, and a feedback circuit for detecting a resistance change of the variable resistance device and controlling a gate voltage of the select transistor according to the detected resistance change.

16 Claims, 16 Drawing Sheets

VARIABLE RESISTANCE MEMORY DEVICE AND RELATED METHOD OF OPERATION

BACKGROUND OF THE INVENTION

Embodiments of the inventive concept relate generally to semiconductor memory devices. More particularly, embodiments of the inventive concept relate to variable resistance memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

In recent years, there has been a steady increase in the demand for nonvolatile memory devices capable of high speed operation and high storage capacity. This demand has been addressed to a certain extent by the widespread adoption of flash memory. However, researchers continue to explore additional types of nonvolatile memory devices with the potential for improved performance and data storage capacity. Examples of these additional types of nonvolatile memory devices include ferroelectric random access memory (FRAM), magnetoresistive random access memory (MRAM), phase change random access memory (PRAM), and resistive random access memory (RRAM).

RRAM is viewed as having the potential for relatively high speed, high storage capacity, and low power consumption. In an RRAM, data is stored using a variable resistance material layer having resistance that can be changed according to a polarity or magnitude of an applied electrical pulse. In some RRAMs, the variable resistance material layer is formed of a colossal magnetoresistive material layer having a perovskite structure or a metal oxide layer in which a conductive filament is modified by an electric pulse. In general, any memory using a variable resistance material layer can be referred to as a variable resistance memory.

Variable resistance memory devices can be classified into unipolar variable resistance devices and bipolar variable resistance devices. In a unipolar variable resistance device, a set pulse for performing a set programming operation and a reset pulse for performing a reset programming operation have the same polarity. In a bipolar variable resistance device, a set pulse for performing a set programming operation and a reset pulse for performing a reset programming operation have a different polarity.

The characteristics of different memory cells of a variable resistance memory device can vary according to a number of factors, such as variances in manufacturing processes, different usage patterns, and so on. Unfortunately, these different characteristics can lead to inconsistent operation and errors. For instance, they can cause memory cells to represent the same target state with different resistance levels, which can lead to read errors.

SUMMARY OF THE INVENTION

According to one embodiment of the inventive concept, a variable resistance memory device, comprises a memory cell comprising a variable resistance device and a select transistor connected in series with the variable resistance device, a write driver that generates a write voltage across the memory cell, and a feedback circuit that detects a resistance change of the variable resistance device and controls a gate voltage of the select transistor according to the detected resistance change.

In certain embodiments, the variable resistance device comprises a bipolar resistance memory material.

In certain embodiments, the select transistor comprises a negative metal oxide semiconductor transistor.

In certain embodiments, during a reset program operation, the write driver provides a reset voltage to a first side of the memory cell adjacent to the variable resistance device, and grounds a second side of the memory cell adjacent to the select transistor.

In certain embodiments, during a set program operation, the write driver grounds the first side and provides a set voltage to the second side.

In certain embodiments, the feedback circuit detects the resistance change by sensing a change in a node voltage apparent on a node located between the variable resistance device and the select transistor. In certain embodiments, the feedback circuit transfers a wordline voltage to a gate of the select transistor where the node voltage is greater than a reference voltage. In certain embodiments, the feedback circuit transfers the node voltage to the gate of the select transistor where the node voltage is less than or equal to the reference voltage.

In certain embodiments, the feedback circuit comprises a pass transistor that provides a node voltage apparent at a node between the variable resistance device and the select transistor to a gate of the select transistor in response to a wordline voltage.

In certain embodiments, the wordline voltage is provided to a gate of the pass transistor. In certain embodiments, the pass transistor transfers the reference voltage to the gate of the select transistor where the node voltage is greater than a reference voltage. In certain embodiments, the pass transistor transfers the node voltage to a gate of the select transistor where the node voltage is less than or equal to the reference voltage. In certain embodiments, the reference voltage has a magnitude equal to a magnitude of the wordline voltage minus a threshold voltage of the pass transistor. In certain embodiments, the feedback circuit further comprises a pull of transistor that grounds the gate of the select transistor where the wordline is inactivated.

According to another embodiment of the inventive concept, a method is provided for performing a write operation of a variable resistance memory device comprising a memory cell comprising a variable resistance device and a select transistor connected in series with the variable resistance device. The method comprises applying a write voltage across the memory cell, detecting whether a node voltage apparent at a node between the variable resistance device and the select transistor has reached a reference voltage, and transferring the node voltage to a gate of the select transistor upon detecting that the distribution voltage is less than or equal to the reference voltage.

In certain embodiments, the reference is transferred to the gate of the select transistor where the node voltage is greater than the reference voltage.

According to another embodiment of the inventive concept, a variable resistance memory device comprises a plurality of memory cells each comprising a variable resistance device and a select transistor, and a plurality of feedback circuits that control gate voltages of the respective select transistors according to resistance changes of the respective variable resistance devices.

In certain embodiments, the variable resistance memory device further comprises an address decoder that provides wordline voltages to wordlines of selected memory cells among the plurality of memory cells, and a read/write circuit that provides write voltages to the selected memory cells through corresponding bit lines.

In certain embodiments, the feedback circuit detects the resistance changes by detecting node voltages apparent at nodes between the respective variable resistance devices and corresponding select transistors.

In certain embodiments, the feedback circuit transfers a node voltage of a selected memory cell to a gate of a corresponding select transistor upon detecting that the node voltage is less than or equal to a reference voltage.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
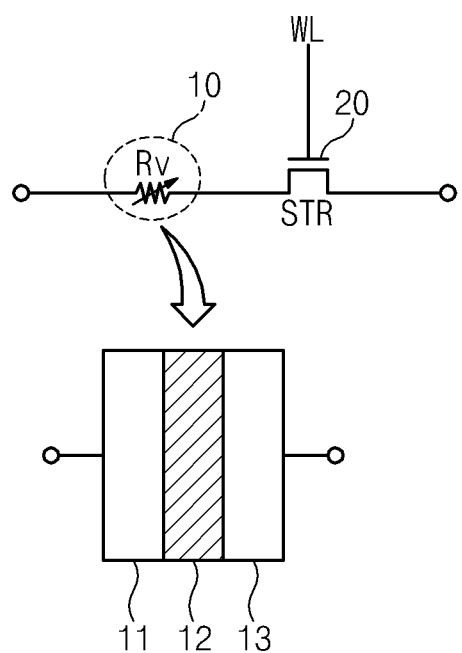
FIG. 1 is a diagram illustrating a structure of a variable resistance memory cell.

FIG. 1 is a diagram illustrating a structure of a variable resistance memory cell.

Referring to FIG. 1, the variable resistance memory cell comprises a variable resistance device 10 and a select device 20.

Variable resistance device 10 comprises a variable resistance material for storing data. Select device 20 provides current to variable resistance device 10 or cuts off current from variable resistance device 10 according to a bias of a wordline WL. Select device 20 typically comprises a negative metal oxide semiconductor (NMOS) transistor as illustrated in the drawing. Alternatively, select device 20 can comprise a positive metal oxide semiconductor (PMOS) transistor or another type of switching device such as a diode.

Variable resistance device 10 comprises a pair of electrodes 11 and 13, and a data storage layer 12 formed between electrodes 11 and 13. Data storage layer 12 typically comprises a bipolar resistance memory material or a unipolar resistance memory material. The bipolar resistance memory material can be programmed to a set state or a reset state according to a polarity of an applied electrical pulse. The unipolar resistance memory material can be programmed to a set state or a reset state by different pulses having the same polarity. The unipolar resistance memory material typically comprises a transition metal oxide such as $NiO_x$ or $TiO_x$. The bipolar resistance memory material typically comprises a perovskite material.

Figure 2:
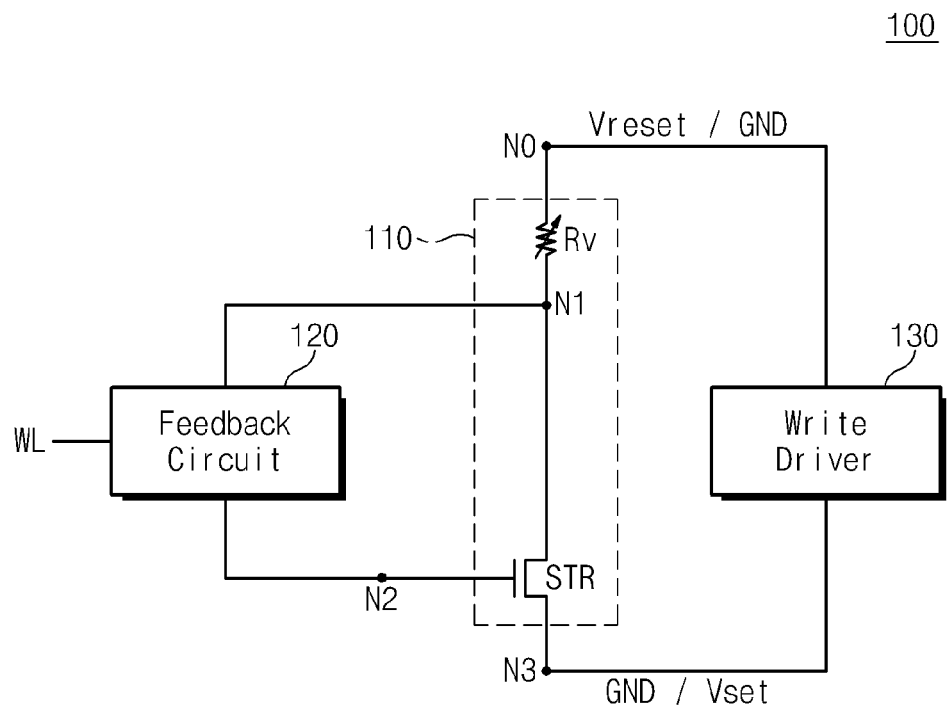
FIG. 2 is a diagram illustrating a variable resistance memory device according to an embodiment of the inventive concept.

FIG. 2 is a diagram illustrating a variable resistance memory device 100 according to an embodiment of the inventive concept.

Referring to FIG. 2, variable resistance memory device 100 comprises a memory cell 110, a feedback circuit 120, and a write driver 130.

Memory cell 110 comprises a variable resistance device Rv and a select transistor STR. For explanation purposes, it will be assumed that select transistor STR comprises an NMOS transistor. In a program operation, a set pulse or a reset pulse is applied to memory cell 110.

To program variable resistance device Rv to a reset state, a reset voltage Vreset is applied to a node N0 connected to memory cell 110 while a node N3 is grounded. Under these conditions, variable resistance device Rv is located at a drain side of select transistor STR.

To program variable resistance device Rv to a set state, a set voltage Vset is applied to node N3 and node N0 is grounded. Under these conditions, variable resistance device Rv is located at a source side of select transistor STR.

Where variable resistance device Rv is programmed to the reset state, it changes from a high resistance to a low resistance. As a result, more current flows through variable resistance device Rv in the reset state than in the set state.

Feedback circuit 120 detects a resistance change of variable resistance device Rv and controls a gate voltage of select transistor STR according to result of the detection. For example, before variable resistance device Rv is programmed to a target state, feedback circuit 120 applies a wordline voltage $V_{WL}$ of a wordline to a gate of select transistor STR at a node N2. After variable resistance device Rv is programmed to the target state, feedback circuit 120 applies a voltage lower than wordline voltage $V_{WL}$ to the gate of select transistor STR. As the gate voltage of select transistor STR decreases, a channel current of select transistor STR decreases accordingly. Consequently, a reset current flowing through variable resistance device Rv is reduced, and variable resistance device Rv is prevented from being programmed further once it has reached the target state.

Write driver 130 provides a set pulse or a reset pulse to memory cell 110. To program memory cell 110 to the reset state, write driver 130 provides reset voltage Vreset to node N0 and provides a ground voltage GND to node N3. To program memory cell 110 to the set state, write driver 130 provides ground voltage GND to node N0 and provides set voltage Vset to node N3. Write driver 130 determines a polarity of a program pulse with reference to input data to be programmed.

The amount of current in variable resistance device Rv varies according to the resistance of variable resistance device Rv. For instance, a relatively larger reset current Irst flows through variable resistance device Rv in the reset state because it has a relatively lower resistance. Accordingly, to ensure accurate program operations, feedback circuit 120 adjusts the gate voltage of select transistor STR based on the amount of current flowing through variable resistance device Rv. Consequently, variable resistance device Rv can be maintained in a target state regardless of variations in the characteristics of different memory cells or of the same memory cell.

Figure 3:
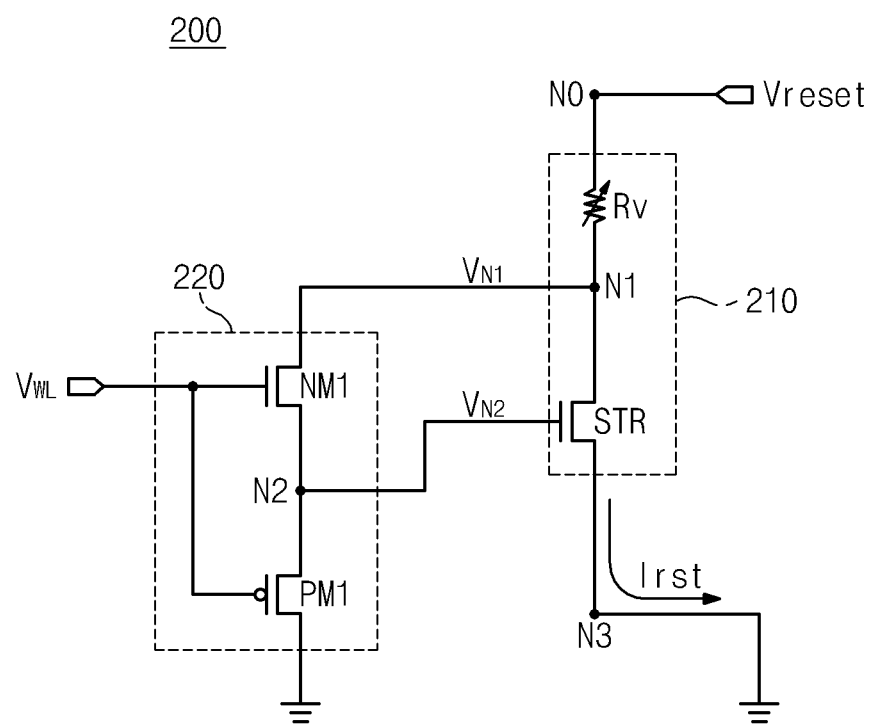
FIG. 3 is a diagram illustrating a variable resistance memory device according to an embodiment of the inventive concept.

FIG. 3 is a circuit diagram illustrating a variable resistance memory device 200 according to an embodiment of the inventive concept. In the diagram of FIG. 3, bias conditions are shown for a reset program operation.

Referring to FIG. 3, variable resistance memory device 200 comprises a memory cell 210 and a feedback circuit 220.

Memory cell 210 comprises a variable resistance device Rv and a select transistor STR. A node N1 between variable resistance device Rv and select transistor STR is electrically connected to feedback circuit 220, and a corresponding node voltage $V_{N1}$ varies according to a resistance of variable resistance device Rv.

A reset voltage Vreset is divided by variable resistance device Rv and select transistor STR. Accordingly, node voltage $V_{N1}$ can be varied by controlling select transistor STR.

In response to reset voltage Vreset, variable resistance device Rv changes from a high resistance state to a low resistance state. Where variable resistance device Rv is in the high resistance state, a voltage drop across variable resistance device Rv is relatively large and node voltage $V_{N1}$ is relatively small. Accordingly, node voltage $V_{N1}$ can be used as an indicator of the resistance state of variable resistance device Rv.

Feedback circuit 220 outputs a node voltage $V_{N2}$ to be applied to a gate of select transistor STR in response to node voltage $V_{N1}$ and a wordline voltage $V_{WL}$. Feedback circuit 220 comprises a pass transistor NM1 and a pull off transistor PM1 that are actuated by wordline voltage $V_{WL}$.

Pass transistor NM1 typically comprises an NMOS transistor, and pull off transistor PM1 typically comprises a PMOS transistor. However, where a level of wordline voltage $V_{WL}$ is inverted, pass transistor NM1 can comprise a PMOS transistor and pull off transistor PM1 can comprise an NMOS transistor.

Pass transistor NM1 and pull off transistor PM1 receive wordline voltage $V_{WL}$ at their respective gates. Pass transistor NM1 controls node voltage $V_{N2}$ according to a size of node voltage $V_{N1}$.

A control operation of select transistor STR by pass transistor NM1 is described below. Where node voltage $V_{N1}$ is greater than a reference voltage $V_{WL}-V_{th}$ ($V_{th}$ is a threshold voltage of pass transistor NM1), pass transistor NM1 sets node voltage $V_{N2}$ as reference voltage $V_{WL}-V_{th}$. Node voltage $V_{N2}$ is provided as a gate voltage of select transistor STR.

Where node voltage $V_{N1}$ is less than or equal to reference voltage $V_{WL}-V_{th}$, pass transistor NM1 passes node voltage $V_{N1}$ to node N2. Accordingly, node voltage $V_{N2}$ is determined by subtracting threshold voltage $V_{th}$ from node voltage $V_{N1}$. In other words, where node voltage $V_{N1}$ is lower than reference voltage $V_{WL}-V_{th}$, a voltage $V_{N1}-V_{th}$ from pass transistor NM1 is provided as a gate voltage of select transistor STR. Thus, a channel current of select transistor STR is reduced. Consequently, a reset current Irst flowing through memory cell 210 is reduced. As reset current Irst is reduced, a reset program operation of variable resistance device Rv is suppressed.

Pull off transistor PM1 is turned on when wordline voltage $V_{WL}$ is low and is turned off when wordline voltage $V_{WL}$ is high. Thus, where wordline WL is unselected, pull off transistor PM1 grounds a node N2, and where wordline WL is selected, pull off transistor PM1 separates node N2 from ground to activate feedback circuit 220.

Figure 4:
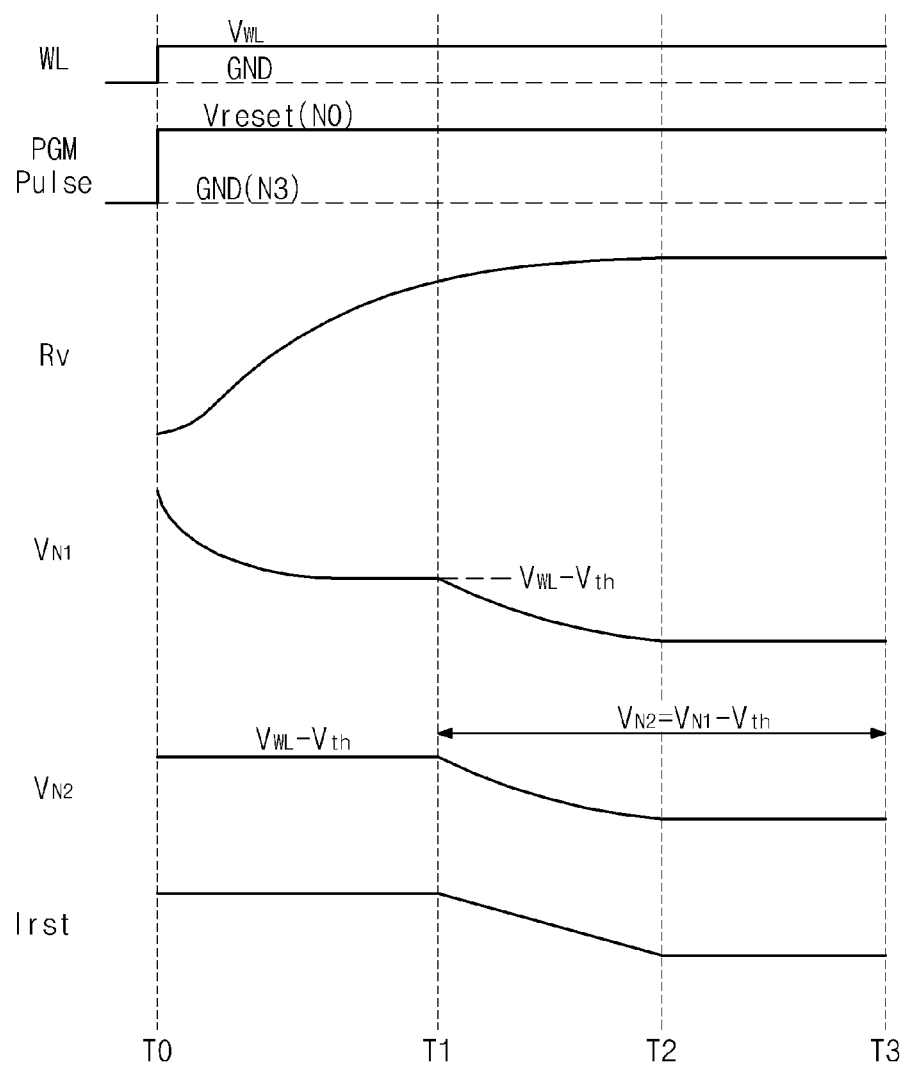
FIG. 4 is a waveform timing diagram illustrating an operation of the variable resistance memory device of FIG. 3.

FIG. 4 is a waveform timing diagram illustrating an operation of variable resistance memory device 200 of FIG. 3. In particular, FIG. 4 illustrates a reset program operation of variable resistance memory device 200. In the reset program operation, the gate voltage of select transistor STR changes according to a resistance of variable resistance device Rv.

At a time T0, wordline voltage $V_{WL}$ is activated to a high level to select memory cell 210, and a program pulse PGM Pulse is generated to program memory cell 210 to the reset state. Reset voltage Vreset is applied to node N0 connected to memory cell 210 while node N3 of memory cell 210 is grounded. Under these conditions, a resistance of variable resistance device Rv increases as illustrated by a resistance curve labeled Rv.

As the resistance of variable resistance device Rv increases, node voltage $V_{N1}$ decreases. During a time interval T0-T1 in which node voltage $V_{N1}$ is higher than reference voltage $V_{WL}-V_{th}$, node voltage $V_{N1}$ maintains a fixed level $V_{WL}-V_{th}$ and a reset current Irst flows through select transistor STR with a substantially constant value.

At time T1, as the resistance of variable resistance device Rv continues to increase, and node voltage $V_{N1}$ continues to decrease until it falls below reference voltage $V_{WL}-V_{th}$. Pass transistor NM1 is then switched on to pass node voltage $V_{N1}$ to node N2. As a result, node voltage $V_{N2}$ assumes a voltage level $V_{WL}-V_{th}$. Voltage level $V_{WL}-V_{th}$ of node N2 is provided as the gate voltage of select transistor STR.

As node voltage $V_{N1}$ decreases, the gate voltage of select transistor STR decreases accordingly. Consequently, a magnitude of reset current Irst flowing through select transistor STR is also reduced. As reset current Irst is reduced, a resistance change of variable resistance device Rv becomes gradual and the reset program operation is suppressed. Accordingly, variable resistance device Rv is programmed to a target state using feedback of node voltage $V_{N1}$.

Time T2 is a time at which variable resistance device Rv arrives at the target state. Node voltage $V_{N1}$, which corresponds to a resistance change of variable resistance device Rv, acts as negative feedback with respect to a current flowing through select transistor STR. The resistance of variable resistance device Rv can be readily programmed to the target state using the negative feedback.

A memory device typically comprises a plurality of memory cells formed in an array. In such a memory device, feedback circuit 220 can control the current through each of the memory cells such that their reset resistances converge regardless of process variations or other differences between the memory cells. Also, feedback circuit 220 can control the current through each memory cell so that consistent programming is achieved even where the memory cells' characteristics change after repetitive programming.

Figure 5:
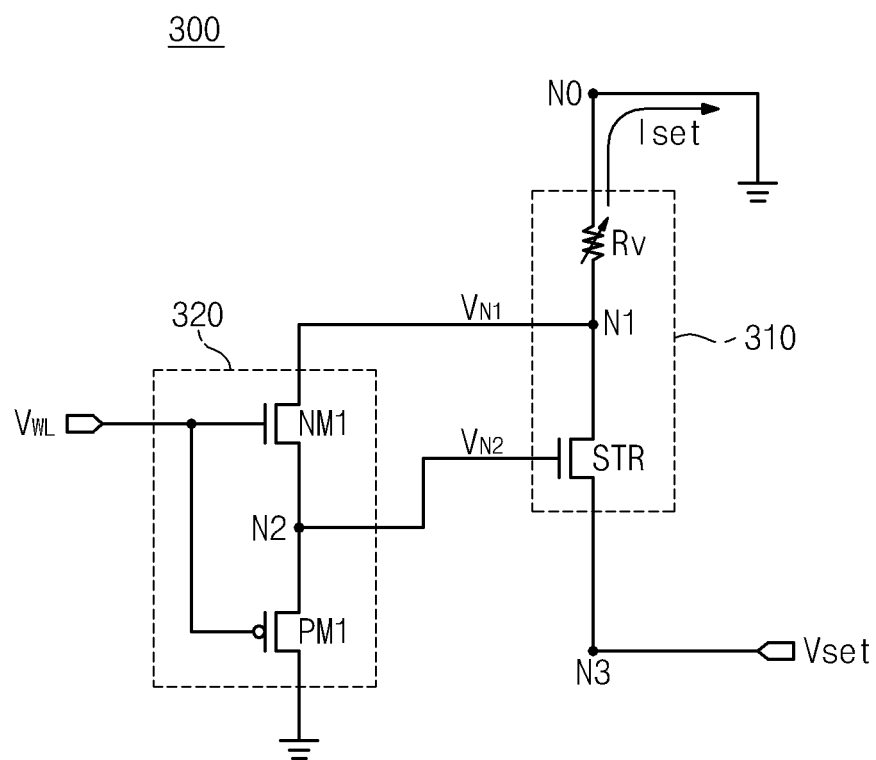
FIG. 5 is a diagram illustrating a variable resistance memory device according to an embodiment of the inventive concept.

FIG. 5 is a circuit diagram illustrating a variable resistance memory device 300 according to an embodiment of the inventive concept. In the diagram of FIG. 5, bias conditions are shown for a set program operation. For explanation purposes, it will be assumed that operating voltages of variable resistance memory device 300 are provided by write driver 130 of FIG. 2.

Referring to FIG. 5, variable resistance memory device 300 comprises a memory cell 310 and a feedback circuit 320. Memory cell 310 and feedback circuit 320 are substantially the same as memory cell 210 and feedback circuit 220 of FIG. 3, respectively.

To program a variable resistance device Rv to a set state, write driver 130 provides a set voltage Vset to a node N3 connected to a select transistor STR. Write driver 130 grounds a node N0 connected to variable resistance device Rv. Set voltage Vset is divided by variable resistance device Rv and select transistor STR to produce a node voltage $V_{N1}$.

In response to set voltage Vset, a resistance of variable resistance device Rv changes from a high resistance state to a low resistance state. As the resistance of variable resistance device Rv decreases, a voltage applied to variable resistance device Rv decreases accordingly.

Feedback circuit 320 outputs a node voltage $V_{N2}$ to be applied as a gate voltage of select transistor STR in response to node voltage $V_{N1}$ and a wordline voltage $V_{WL}$. Feedback circuit 320 comprises a pass transistor NM1 and a pull off transistor PM1. Pass transistor NM1 typically comprises an NMOS transistor, and pull off transistor PM1 typically comprises a PMOS transistor. However, where a level of wordline voltage $V_{WL}$ is inverted, pass transistor NM1 can comprise a PMOS transistor and pull off transistor PM1 can comprise an NMOS transistor.

Pass transistor NM1 and pull off transistor PM1 receive wordline voltage $V_{WL}$ as a gate voltage. Pass transistor NM1 controls node voltage $V_{N2}$ according to a size of node voltage $V_{N1}$. Node voltage $V_{N2}$ corresponds to a gate voltage of select transistor STR.

A control operation of select transistor STR by pass transistor NM1 is described below. Where node voltage $V_{N1}$ is higher than a reference voltage $V_{WL}-V_{th}$ ($V_{th}$ is a threshold voltage of pass transistor NM1), pass transistor NM1 sets node voltage $V_{N2}$ as reference voltage $V_{WL}-V_{th}$. Node voltage $V_{N2}$ is provided as a gate voltage of select transistor STR.

Where node voltage $V_{N1}$ is equal to or lower than reference voltage $V_{WL}-V_{th}$, pass transistor NM1 passes node voltage $V_{N1}$ to a node N2. Thus, node voltage $V_{N2}$ can be node voltage $V_{N1}$ minus threshold voltage $V_{th}$. In other words, where node voltage $V_{N1}$ is lower than reference voltage $V_{WL}-V_{th}$, a voltage $V_{N1}-V_{th}$ generated through pass transistor NM1 is provided as a gate voltage of select transistor STR. Consequently, a channel current of select transistor STR is reduced, and a set current Iset flowing through memory cell 310 is reduced to suppress the set program operation.

Pull off transistor PM1 is turned on when wordline voltage $V_{WL}$ is low and is turned off when line voltage $V_{WL}$ is high. Accordingly, where wordline WL is unselected, pull off transistor PM1 grounds node N2. Otherwise, where wordline WL is selected, pull off transistor PM1 separates node N2 from ground to activate feedback circuit 320.

In the embodiment of FIG. 5, in a set program operation, feedback circuit 320 reduces a program current once a resistance of variable resistance device Rv reaches the target level. Accordingly, memory cell 310 can be accurately programmed even though its programming characteristics may vary according to different factors such as manufacturing process variations, or repetitive programming.

Figure 6:
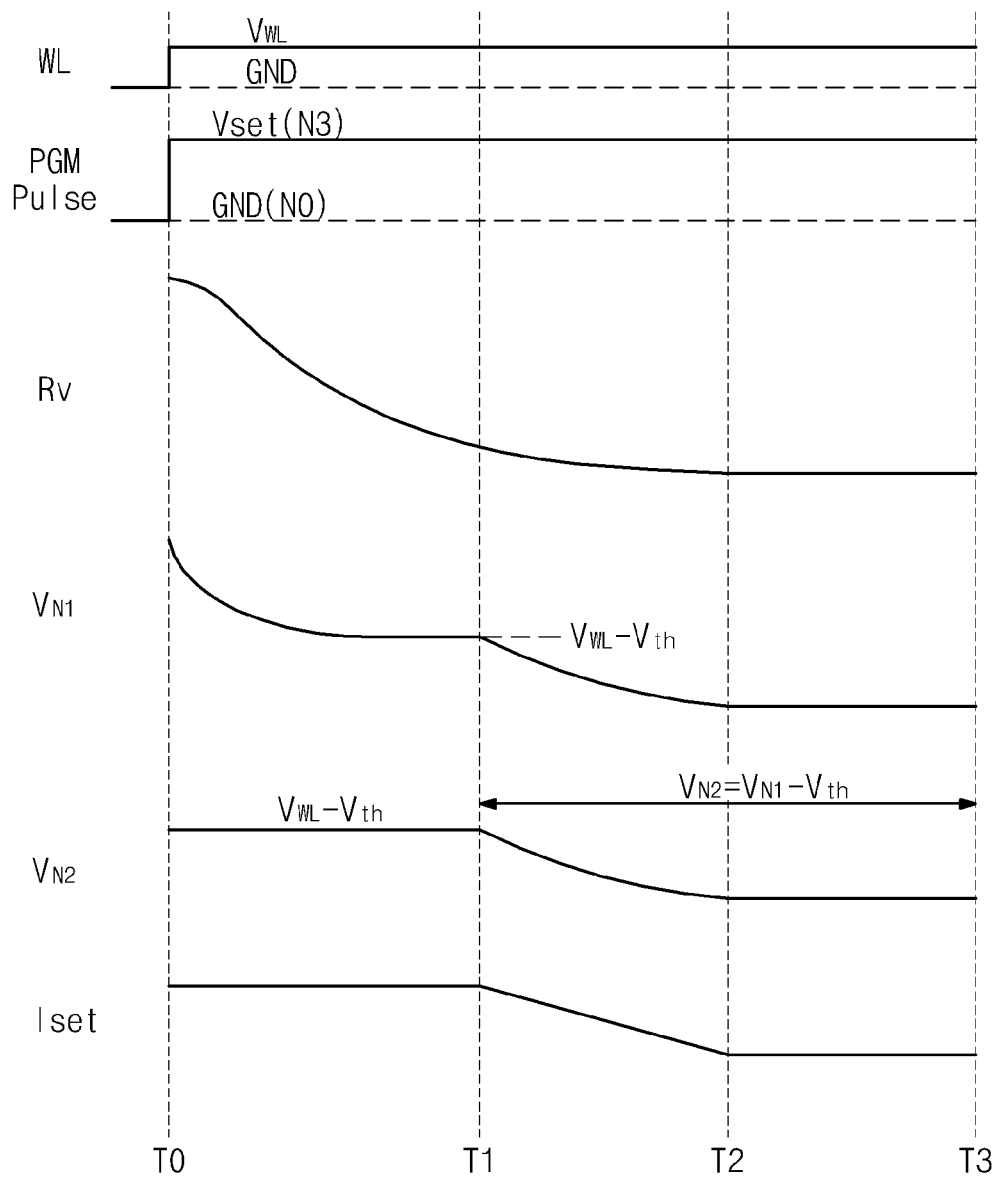
FIG. 6 is a waveform timing diagram illustrating an operation of the variable resistance memory device of FIG. 5.

FIG. 6 is a waveform timing diagram illustrating an operation of variable resistance memory device 300 of FIG. 5. In particular, FIG. 6 illustrates a set program operation of variable resistance memory device 300. In the set program operation, the gate voltage of select transistor STR changes according to a resistance of variable resistance device Rv.

At time T0, wordline voltage $V_{WL}$ is activated to a high level to select memory cell 310. A program pulse PGM Pulse is generated to program memory cell 310 to the set state. In particular, node N0 of memory cell 310 is grounded, and set voltage Vset is applied to node N3 of memory cell 310. Under these conditions, a resistance of variable resistance device Rv is reduced from a high resistance to a low resistance as indicated by a resistance curve labeled Rv.

As the resistance of variable resistance device Rv decreases, node voltage $V_{N1}$ of node N1 decreases accordingly. During a time interval T0-T1 in which node voltage $V_{N1}$ is higher than the reference voltage $V_{WL}-V_{th}$, node voltage $V_{N2}$ remains relatively constant and a substantially uniform set current Iset flows through select transistor STR.

At time T1, as a resistance of variable resistance device Rv continues to decrease, node voltage $V_{N1}$ distributed to node N1 continues to decrease as well. Consequently, node voltage $V_{N1}$ becomes lower than reference voltage $V_{WL}-V_{th}$. Then pass transistor NM1 transmits node voltage $V_{N1}$ to node N2, and node N2 is set to a voltage $V_{N1}-V_{th}$, where $V_{th}$ is a threshold voltage of pass transistor NM1. Voltage $V_{N1}-V_{th}$ of node N2 is provided to the gate of select transistor STR.

As a level of node voltage $V_{N1}$ is reduced, a gate voltage of select transistor STR is also reduced. Accordingly, a magnitude of a set current Iset flowing through select transistor STR is also reduced. As set current Iset is reduced, a resistance change of variable resistance device Rv becomes gentle and the set program operation is suppressed. Accordingly, variable resistance device Rv is programmed to a target state using feedback of node voltage $V_{N1}$.

Time T2 is a time at which variable resistance device Rv arrives at the target state. Node voltage $V_{N1}$, which corresponds to a resistance change of variable resistance device Rv, acts as negative feedback with respect to a current flowing through select transistor STR. The resistance of variable resistance device Rv can be readily programmed to the target state using the negative feedback.

A memory device typically comprises a plurality of memory cells formed in an array. In such a memory device, feedback circuit 320 can control the current through each of the memory cells such that their reset resistances converge regardless of process variations or other differences between the memory cells. Also, feedback circuit 320 can control the current through each memory cell so that consistent programming is achieved even where the memory cells' characteristics change after repetitive programming.

Figure 7:
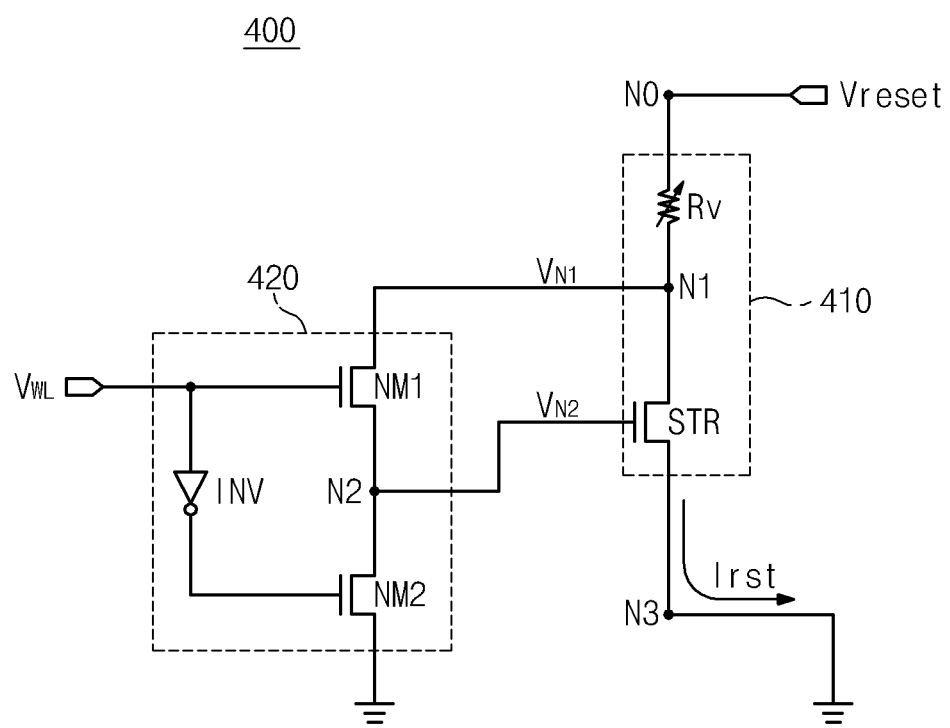
FIGS. 7 through 11 are diagrams illustrating variable resistance memory devices according to various alternative embodiments of the inventive concept.
Figure 8:
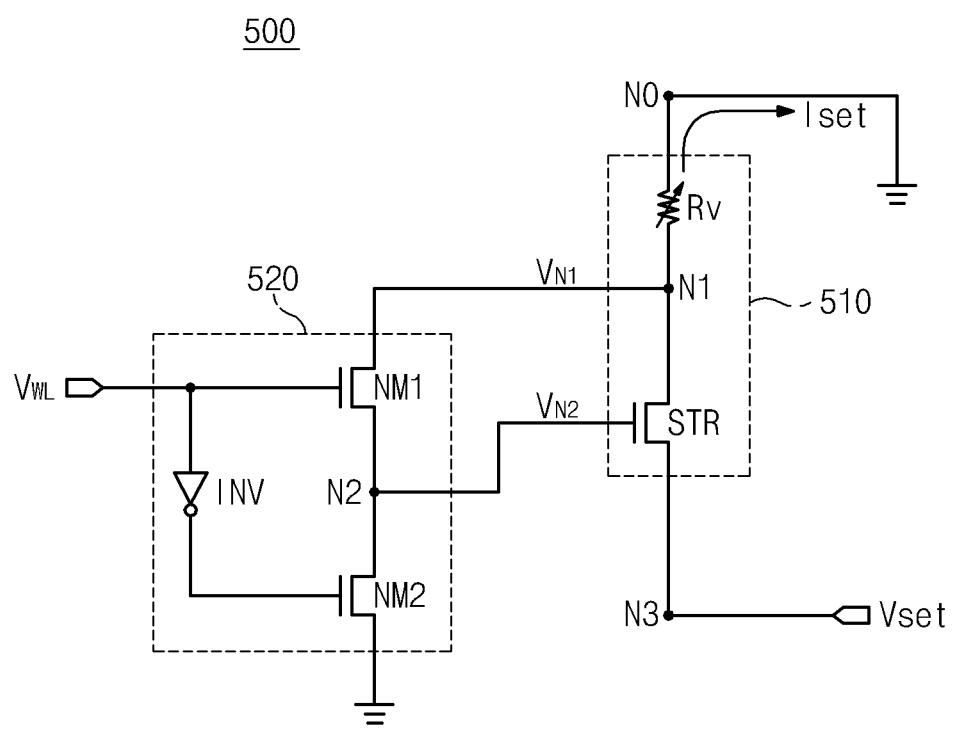

FIGS. 7 and 8 are circuit diagrams illustrating variable resistance devices according to another embodiment of the inventive concept.

Referring to FIG. 7, a variable resistance memory device 400 is substantially the same as variable resistance memory device 200 of FIG. 3 except for the structure of a feedback circuit 420. Feedback circuit 420 of variable resistance memory device 400 comprises a pass transistor NM1 and a pull off transistor NM2. Pass transistor NM1 and pull off transistor NM2 each comprise an NMOS transistor. Where a wordline WL is not selected, an inverted wordline voltage is provided to pull off transistor NM2 to inactivate feedback circuit 420. The inverted wordline voltage is produced by an inverter INV interposed between wordline WL and pull off transistor NM2.

Referring to FIG. 8, a variable resistance memory device 500 is substantially the same as variable resistance memory device 300 of FIG. 5 except for the structure of a feedback circuit 520. Feedback circuit 520 of variable resistance memory device 500 comprises a pass transistor NM1 and a pull off transistor NM2. Pass transistor NM1 and pull off transistor NM2 each comprise an NMOS transistor. Where a wordline WL is not selected, an inverted wordline voltage is provided to pull off transistor NM2 for inactivating feedback circuit 520. The inverted wordline voltage is produced by an inverter INV interposed between wordline WL and pull off transistor NM2.

Figure 9:
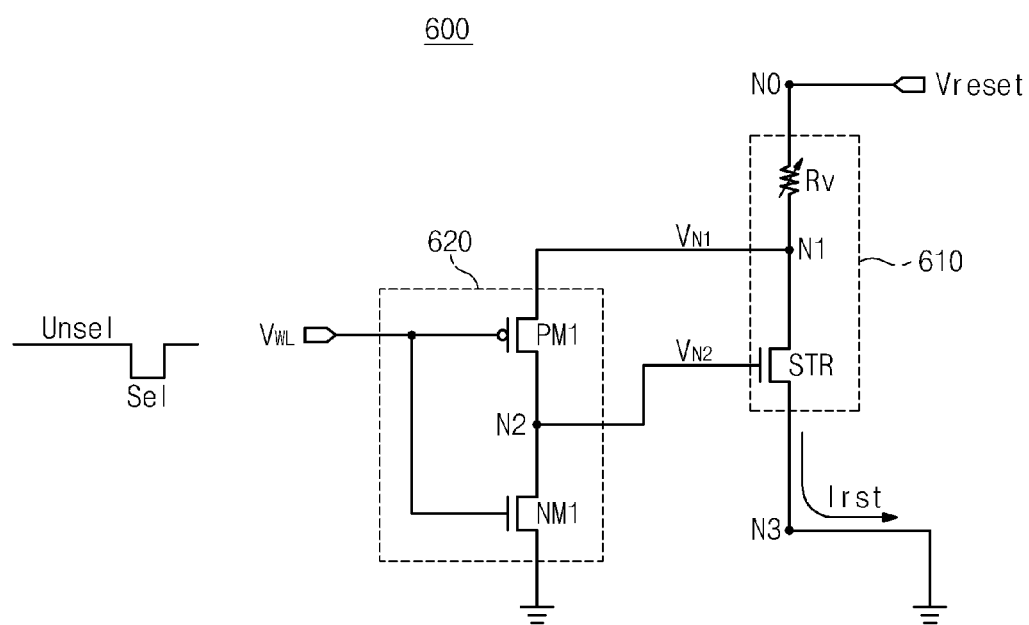
Figure 10:
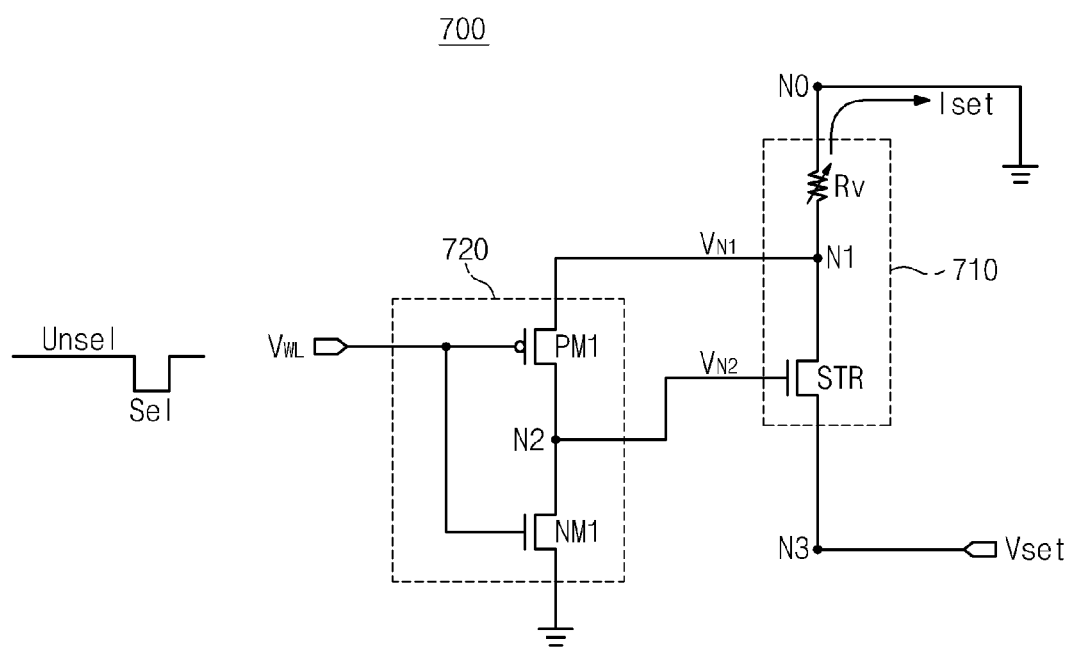

FIGS. 9 and 10 are circuit diagrams illustrating variable resistance devices in accordance with another embodiment of the inventive concept.

Referring to FIG. 9, a variable resistance memory device 600 is substantially the same as variable resistance memory device 200 of FIG. 3 except for the structure of a feedback circuit 620. Feedback circuit 620 is similar to feedback circuit 220 of variable resistance memory device 200, except that a pass transistor PM1, which is a PMOS transistor, is arranged between nodes N1 and N2, and a pull off transistor NM2, which is an NMOS transistor, is located between node N2 and ground. As indicated by a wave labeled "Unsel" and "Sel," feedback circuit 620 is activated by setting wordline voltage $V_{WL}$ to a low level.

Referring to FIG. 10, a variable resistance memory device 700 is substantially the same as variable resistance memory device 300 illustrated in FIG. 5 except for the structure of a feedback circuit 720. Feedback circuit 720 is similar to feedback circuit 320 of variable resistance memory device 300, except that a pass transistor PM1, which is a PMOS transistor, is arranged between nodes N1 and N2, and a pull off transistor NM2, which is an NMOS transistor, is located between node N2 and ground. As indicated by a wave labeled "Unsel" and "Sel," feedback circuit 720 is activated by setting wordline voltage $V_{WL}$ to a low level.

Figure 11:
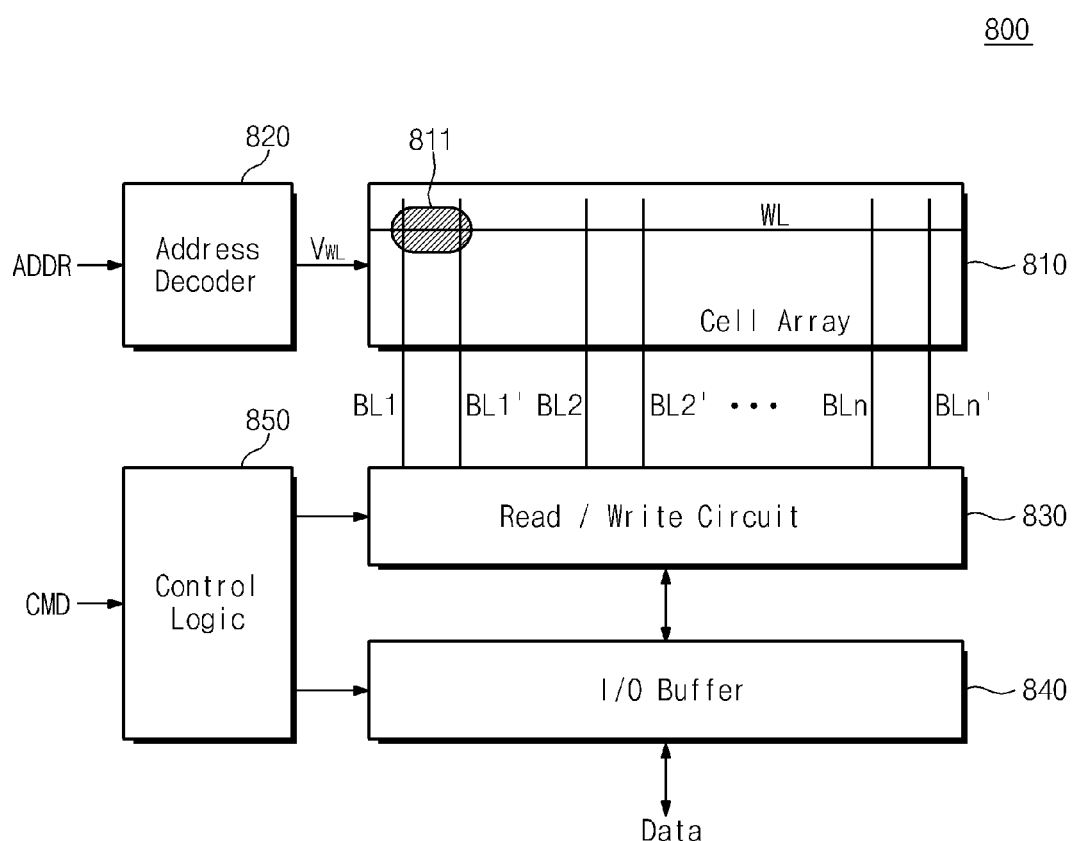

FIG. 11 is a block diagram illustrating a variable resistance memory device 800 according to an embodiment of the inventive concept.

Referring to FIG. 11, variable resistance memory device 800 comprises a cell array 810, an address decoder 820, a read/write circuit 830, an input/output buffer 840, and control logic 850.

Although not illustrated in FIG. 11, cell array 810 comprises a plurality of memory cells arranged in rows connected to corresponding wordlines and columns connected to corresponding bit lines. Each memory cell comprises a bipolar variable resistance memory device. As an example, a memory cell 811 receives a set pulse or a reset pulse through a pair of complementary bit lines BL1 and BL1'.

Multiple memory cells in cell array 810 can include one of the feedback circuits illustrated in FIGS. 2, 3, 5, 7, 8, 9, and 10. Thus, each of the memory cells can be uniformly programmed in a target state using the feedback circuit. Also, even though characteristics of the memory cells may change as they are repeatedly programmed, their resistance distributions can be maintained relatively consistent through use of the feedback circuit.

Address decoder 820 decodes an address ADDR that is input to select a row and a column. Address decoder 820 selects a wordline corresponding to a row address being input when a write operation is performed. Address decoder 820 selects a bit line corresponding to a column address being input.

Read/write circuit 830 reads data stored in cell array 810 or writes data input in cell array 810 under the control of control logic 850. Where write data input to memory cell 811 corresponds to a set state, read/write circuit 830 provides a set pulse through a pair of bit lines BL1 and BL1'. Where a read operation is performed, read/write circuit 830 reads out data by sensing a resistance of selected memory cells.

Input/output buffer 840 temporarily stores data provided received from an external source under the control of control logic 850 in a program operation. The data temporarily stored in input/output buffer 840 is provided to read/write circuit 830 to be written in cell array 810. Input/output buffer 840 temporarily stores read data provided from read/write circuit 830. Input/output buffer 840 transfers the stored data to an external destination requesting the stored data. In some embodiments, input/output buffer 840 temporarily stores a command or an address provided from an external source and transfers the command or the address to control logic 850 or address decoder 820.

Control logic 850 decodes a command CMD provided from an external source to control read/write circuit 830 and input/output buffer 840. Control logic 850 controls read/write circuit 830 to read or write selected memory cells according to a result of decoding command CMD. Where the result of decoding command CMD indicates a read operation, control logic 850 controls read/write circuit 830 to read out data stored in the selected memory cells. Where the result of decoding command CMD indicates a program operation, control logic 850 controls read/write circuit 830 to write input data to the selected memory cells.

Variable resistance memory device 800 incorporates a feedback circuit to accurately program memory cells to a target state. Although the embodiment of FIG. 11 incorporates a feedback circuit in each memory cell, the variable resistance memory device 800 can be modified so that feedback circuits are formed outside cell array 810.

Figure 12:
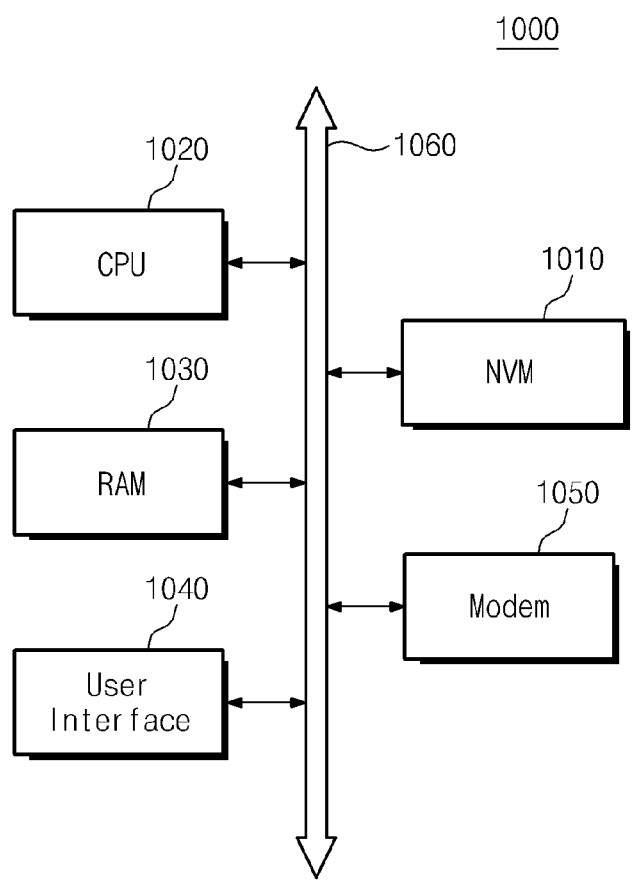
FIG. 12 is a block diagram illustrating a computer system comprising a variable resistance memory device according to an embodiment of the inventive concept.

FIG. 12 is a block diagram illustrating a computer system 1000 comprising a variable resistance memory device 1010 according to an embodiment of the inventive concept. Computer system 1000 comprises variable resistance memory device 1010, a microprocessor 1020, a RAM 1030, a user interface 1040, and a modem 1050 such as a baseband chipset that are electrically connected to a system bus 1060.

Where computer system 1000 is a mobile device, it can also include a battery for supplying an operating voltage. Computer system 1000 can further comprise additional features such as an application chipset, a camera image processor (CIS), or a mobile dynamic random access memory.

Figure 13:
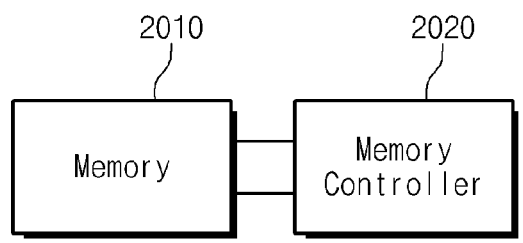
FIG. 13 is a block diagram illustrating a memory system comprising a variable resistance memory device according to an embodiment of the inventive concept.

FIG. 13 is a block diagram illustrating a memory system comprising a variable resistance memory device according to an embodiment of the inventive concept. Referring to FIG. 13, the memory system comprises a memory device 2010 and a memory controller 2020 electrically connected to memory device 2010. Memory device 2010 can be similar to one of the variable resistance memory devices described above with reference to FIGS. 2 through 11. Memory controller 2020 provides a signal for controlling memory device 2010. For example, memory controller 2020 can provide a command and an address for accessing memory device 2010.

Memory controller 2020 comprises a memory interface, a host interface, an error correction code (ECC) circuit, a central processing unit (CPU), and a buffer memory. The memory interface provides data received from the buffer memory to memory device 2010 or transfers data read from memory device 2010 to the buffer memory. Also, the memory interface can provide a command or an address received from an external host to memory device 2010.

The host interface communicates with an external host using a protocol such as universal serial bus (USB), small computer system interface (SCSI), peripheral component interconnect (PCI) express, an advanced technology attachment (ATA), parallel ATA (PATA), serial ATA (SATA), or serial attached small computer system interface (SCSI) (SAS).

The ECC circuit generates an ECC from data being transferred to memory device 2010. The generated ECC is stored in a specific area of memory device 2010 together with data. The ECC circuit detects errors in data read from memory device 2010. Where a detected error is in correctable, the ECC circuit corrects the detected error.

The CPU analyzes and processes signals received from an external host. The CPU controls the external host or memory device 2010 through the host interface or the memory interface. The CPU controls writing, reading, and erasing operations of memory device 2010 according to firmware used to drive memory device 2010. The buffer memory temporarily stores writing data provided from the external host or data read from memory device 2010.

Figure 14:
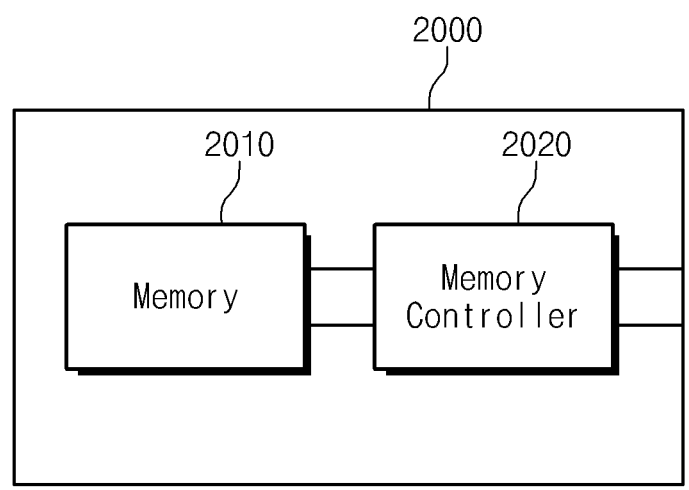
FIG. 14 is a block diagram illustrating a memory card comprising a variable resistance memory device according to an embodiment of the inventive concept.

FIG. 14 is a block diagram illustrating a memory card 2000 comprising a variable resistance memory device according to an embodiment of the inventive concept. The embodiment of FIG. 14 is substantially the same as the embodiment of FIG. 13 except that memory device 2010 and memory controller 2020 are mounted in memory card 2000. Memory card 2000 can be built in an information processing device such as a digital camera, a personal media player (PMP), a mobile phone and a notebook computer. Memory card 2000 can comprise, for example, a multimedia card (MMC), a secure digital (SD) card, a micro SD card, a memory stick, an identification (ID) card, a personal computer memory card international association (PCMCIA) card, a chip card, a USB card, a smart card, or a compact flash (CF) card.

Figure 15:
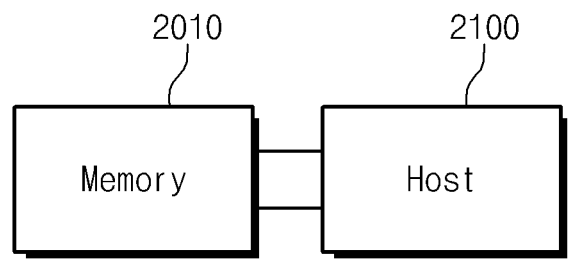
FIG. 15 is a block diagram illustrating a host connected to a variable resistance memory device according to an embodiment of the inventive concept.

FIG. 15 is a block diagram illustrating a host connected to a variable resistance memory device according to an embodiment of the inventive concept. In the embodiment of FIG. 15, memory device 2010 is connected to a host 2100. Host 2100 typically comprises an information processing device such as a digital camera, a PMP, a mobile phone, or a notebook computer. Host 2100 provides a control signal for controlling memory device 2010. For example, host 2100 can provide a command and an address for controlling memory device 2010. Memory device 2010 can be substantially the same as one of the variable resistance memory devices described with reference to FIGS. 2 through 13.

Figure 16:
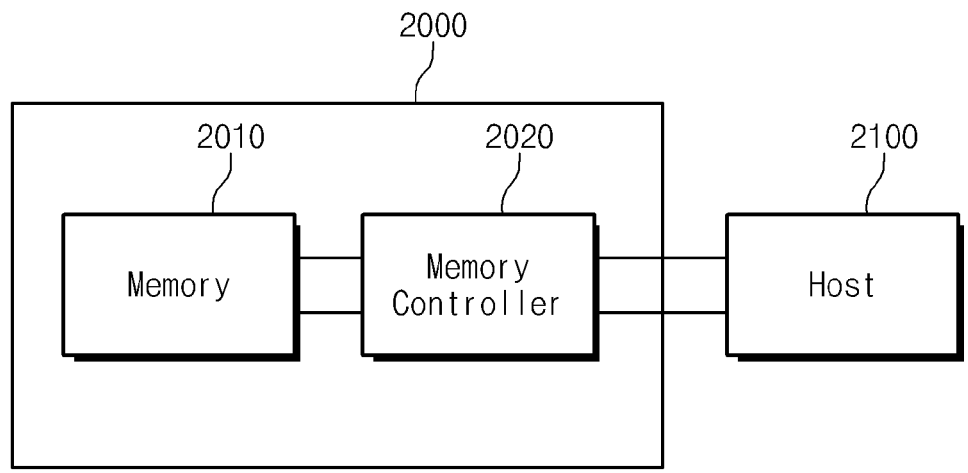
FIG. 16 is a block diagram illustrating a computing system comprising the memory card of FIG. 14.

FIG. 16 is a block diagram illustrating a computing system comprising the memory card of FIG. 14 according to an embodiment of the inventive concept. In the embodiment of FIG. 16, host 2100 is electrically connected to memory card 2000. Host 2100 provides a command, an address, and data to memory controller 2020. Memory controller 2020 provides a control signal for accessing memory device 2010 to memory device 2010. In certain embodiments, memory device 2010 comprises feedback circuit 120 of FIG. 2.

Figure 17:
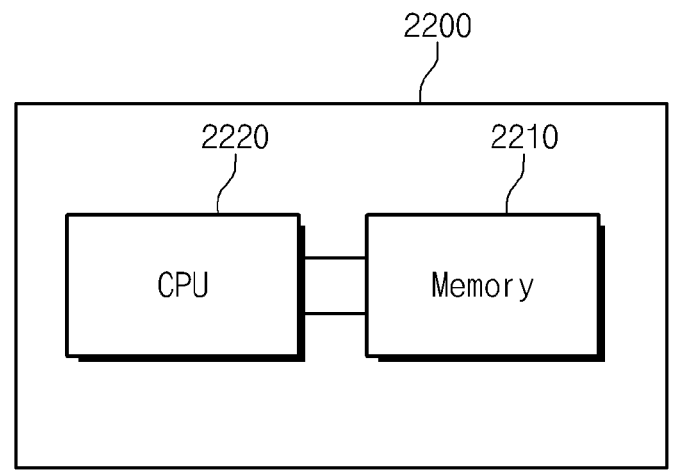
FIG. 17 is a block diagram illustrating a computer system comprising a variable resistance memory device connected to a central processing unit according to an embodiment of the inventive concept.

FIG. 17 is a block diagram illustrating a computer system 2200 comprising a variable resistance memory device 2210 connected to a CPU 2220 according to an embodiment of the inventive concept.

Memory device 2210 can be electrically connected to CPU 2220 using a connection such as a data bus. Computer system 2200 can comprise an information processing device such as a digital camera, a PMP, a mobile phone, or a notebook computer. In certain embodiments, memory device 2210 comprises feedback circuit 120 of FIG. 2.

Figure 18:
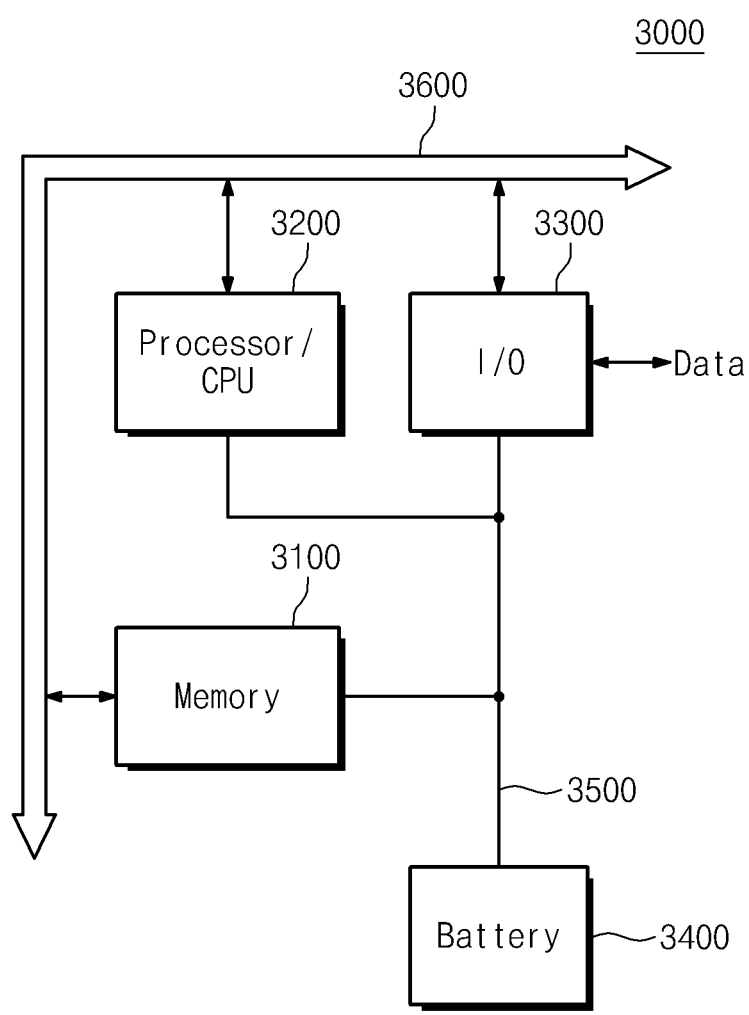
FIG. 18 is a block diagram illustrating a portable system comprising a variable resistance memory device according to an embodiment of the inventive concept.

FIG. 18 is a block diagram illustrating a portable system 3000 comprising a variable resistance memory device according to an embodiment of the inventive concept. In portable system 3000, a memory device 3100 is connected to a micro processor 3200 through a bus line 3600. Memory device 3100 operates as a main memory of portable system 3000. A battery 3400 supplies a power supply to microprocessor 3200, an input/output device 3300, and memory device 3100 through a power supply line 3500.

Where data is provided from an external source to input/output device 3300, microprocessor 3200 receives and processes the data through bus line 3600, and then provides data received or processed to memory device 3100 through bus line 3600. Memory device 3100 stores the data provided through bus line 3600 in selected memory cells. Also, data stored in selected memory cells can be read by microprocessor 3200 and output to an external destination through input/output device 3300.

Where power supply is not supplied to power supply line 3500, variable resistance cell of memory device 3100 is able to retain stored data because it is a nonvolatile memory device. In addition, memory device 3100 can provide relatively efficient operation and low power consumption compared with certain other memory devices.

Figure 19:
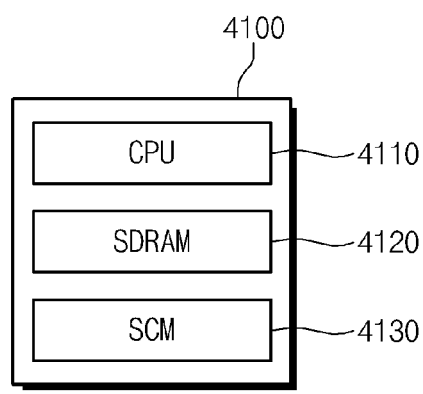
FIG. 19 is a block diagram illustrating a memory system comprising a variable resistance memory device according to an embodiment of the inventive concept.

FIG. 19 is a block diagram illustrating a memory system comprising a variable resistance memory device according to an embodiment of the inventive concept. In the embodiment of FIG. 19, the variable resistance memory is used in place of a flash memory device.

Referring to FIG. 19, a memory system 4100 comprises a CPU 4100, a synchronous dynamic random access memory (SDRAM) 4120, and a storage class memory (SCM) 4130. Here, SCM 4130 is used as a data storage memory instead of a flash memory.

In memory system 4100, SCM 4130 has a higher data access speed than a flash memory. For example, in a PC environment where CPU 4110 operates at 4 GHz, a phase change memory device, which is a type of SCM 4130, can have an access speed of about 32 times that of a flash memory. Consequently, memory system 4100 fitted with SCM 4130 can have an access speed higher than a memory system fitted with a flash memory.

Figure 20:
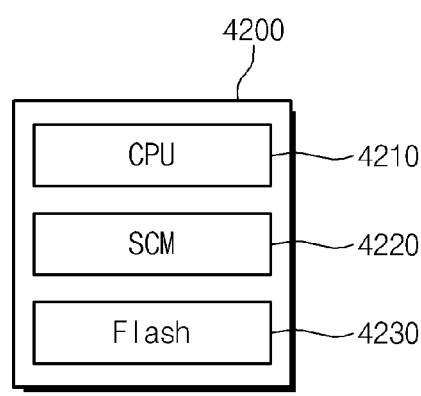
FIG. 20 is a block diagram illustrating a memory system comprising a variable resistance memory device according to an embodiment of the inventive concept.

FIG. 20 is a block diagram illustrating a memory system comprising a variable resistance memory device according to an embodiment of the inventive concept. In the embodiment of FIG. 20, the variable resistance memory is used in place of an SDRAM.

Referring to FIG. 20, a memory system 4200 comprises a CPU 4210, a SCM 4220 and a flash memory 4230. SCM 4130 is used as a main memory instead of an SDRAM.

SCM 4220 consumes a relatively low amount of power compared with an SDRAM. In some computer systems, a main memory accounts for about 40 percent of the overall power consumption. However, SCM 4220 can reduce dynamic energy consumption by an average 53 percent and energy consumption due to a power leakage by an average 73 percent compared with a DRAM. Accordingly, a memory system comprising an SCM 4220 instead of an SDRAM can provide reduced power consumption.

Figure 21:
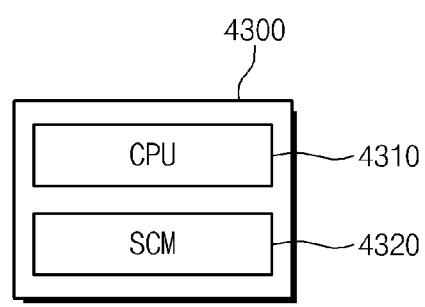
FIG. 21 is a block diagram illustrating a memory system comprising a variable resistance memory device according to an embodiment of the inventive concept.

FIG. 21 is a block diagram illustrating a memory system 4300 comprising a variable resistance memory device according to an embodiment of the inventive concept. In the embodiment of FIG. 21, a variable resistance memory is used in place of an SDRAM and a flash memory.

Referring to FIG. 21, memory system 4300 comprises a CPU 4300 and a SCM 4320. SCM 4320 is used as a main memory instead of an SDRAM and is used as a data storage memory instead of a flash memory. Memory system 4300 can provide potential benefits in terms of data access speed, power supply, usage of space, and cost.

The above-described variable resistance memory devices can be mounted in various types of packages. For example, the variable resistance memory devices can be mounted in packages with configurations such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), wafer-level processed stack package (WSP), and mounted.

As indicated by the foregoing, in certain embodiments of the inventive concept, when a program operation is performed, the amount of current in a memory cell is controlled using a feedback technique. This can improve the accuracy of the program operation, which can produce more consistent program states among a plurality of memory cells and can prevent errors from occurring in read operations of the memory cells.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A variable resistance memory device, comprising:
a memory cell comprising a variable resistance device and a select transistor connected in series with the variable resistance device;
a write driver that generates a write voltage across the memory cell during a write operation of the variable resistance device; and
a feedback circuit that detects a resistance change of the variable resistance device during the write operation and controls a gate voltage of the select transistor during the write operation according to the detected resistance change.

2. The variable resistance memory device of claim 1, wherein the variable resistance device comprises a bipolar resistance memory material.

3. The variable resistance memory device of claim 1, wherein the select transistor comprises a negative metal oxide semiconductor (NMOS) transistor.

4. The variable resistance memory device of claim 1, wherein, during a reset program operation, the write driver provides a reset voltage to a first side of the memory cell adjacent to the variable resistance device, and grounds a second side of the memory cell adjacent to the select transistor.

5. The variable resistance memory device of claim 4, wherein, during a set program operation, the write driver grounds the first side and provides a set voltage to the second side.

6. The variable resistance memory device of claim 1, wherein the feedback circuit detects the resistance change by sensing a change in a node voltage apparent on a node located between the variable resistance device and the select transistor.

7. The variable resistance memory device of claim 6, wherein the feedback circuit transfers a wordline voltage to a gate of the select transistor where the node voltage is greater than a reference voltage.

8. The variable resistance memory device of claim 7, wherein the feedback circuit transfers the node voltage to the gate of the select transistor where the node voltage is less than or equal to the reference voltage.

9. The variable resistance memory device of claim 1, wherein the feedback circuit comprises a pass transistor that provides a node voltage apparent at a node between the variable resistance device and the select transistor to a gate of the select transistor in response to a wordline voltage.

10. The variable resistance memory device of claim 9, wherein the wordline voltage is provided to a gate of the pass transistor.

11. The variable resistance memory device of claim 10, wherein the pass transistor transfers the reference voltage to the gate of the select transistor where the node voltage is greater than a reference voltage.

12. The variable resistance memory device of claim 11, wherein the pass transistor transfers the node voltage to a gate of the select transistor where the node voltage is less than or equal to the reference voltage.

13. The variable resistance memory device of claim 11, wherein the reference voltage has a magnitude equal to a magnitude of the wordline voltage minus a threshold voltage of the pass transistor.

14. The variable resistance memory device of claim 13, wherein the feedback circuit further comprises a pull of transistor that grounds the gate of the select transistor where the wordline is inactivated.

15. A method of performing a write operation of a variable resistance memory device comprising a memory cell comprising a variable resistance device and a select transistor connected in series with the variable resistance device, the method comprising:
applying a write voltage across the memory cell;
detecting whether a node voltage apparent at a node between the variable resistance device and the select transistor has reached a reference voltage while the write voltage is applied across the memory cell; and
transferring the node voltage to a gate of the select transistor upon detecting that the distribution voltage is less than or equal to the reference voltage.

16. The writing method of claim 15, wherein the reference is transferred to the gate of the select transistor where the node voltage is greater than the reference voltage.

* * * * *